(12) United States Patent
Uppal et al.

(10) Patent No.: US 11,664,294 B2
(45) Date of Patent: May 30, 2023

(54) PHASE CHANGE MATERIALS FOR ELECTROMAGNETIC INTERFERENCE SHIELDING AND HEAT DISSIPATION IN INTEGRATED CIRCUIT ASSEMBLIES

(71) Applicant: INTEL CORPORATION, Santa Clara, CA (US)

(72) Inventors: Aastha Uppal, Chandler, AZ (US);
Je-Young Chang, Phoenix, AZ (US);
Weihua Tang, Chandler, AZ (US);
Minseok Ha, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 995 days.

(21) Appl. No.: 16/241,158

(22) Filed: Jan. 7, 2019

(65) Prior Publication Data

US 2020/0219790 A1    Jul. 9, 2020

(51) Int. Cl.
*H01L 21/56* (2006.01)
*H01L 23/34* (2006.01)
*H01L 23/427* (2006.01)
*H01L 23/00* (2006.01)
*H01L 23/552* (2006.01)
*H01L 23/31* (2006.01)
*H01L 21/48* (2006.01)

(52) U.S. Cl.
CPC ........ *H01L 23/427* (2013.01); *H01L 21/4882* (2013.01); *H01L 21/565* (2013.01); *H01L 23/3128* (2013.01); *H01L 23/552* (2013.01); *H01L 24/09* (2013.01); *H01L 24/17* (2013.01); *H01L 24/73* (2013.01); *H01L 24/81* (2013.01); *H01L 2924/14* (2013.01)

(58) Field of Classification Search
CPC . H01L 23/427; H01L 21/4882; H01L 21/565; H01L 23/3128; H01L 23/552; H01L 24/09; H01L 24/17; H01L 24/73; H01L 24/81; H01L 2924/14
USPC ...................................................... 257/714
See application file for complete search history.

(56) References Cited

U.S. PATENT DOCUMENTS

2014/0217575 A1*  8/2014  Hung ..................... H01L 23/473
                                                    257/713
2018/0348434 A1*  12/2018  Yim ........................ H01L 24/14

* cited by examiner

*Primary Examiner* — Didarul A Mazumder
(74) *Attorney, Agent, or Firm* — Essential Patents Group, LLP

(57) ABSTRACT

An integrated circuit assembly may be formed using a phase change material as an electromagnetic shield and as a heat dissipation mechanism for the integrated circuit assembly. In one embodiment, the integrated circuit assembly may comprise an integrated circuit package including a first substrate having a first surface and an opposing second surface, and at least one integrated circuit device having a first surface and an opposing second surface, wherein the at least one integrated circuit device is electrically attached by the first surface thereof to the first surface of the first substrate; and a phase change material formed on the integrated circuit package.

18 Claims, 5 Drawing Sheets

PHASE CHANGE MATERIALS FOR ELECTROMAGNETIC INTERFERENCE SHIELDING AND HEAT DISSIPATION IN INTEGRATED CIRCUIT ASSEMBLIES

TECHNICAL FIELD

Embodiments of the present description generally relate to electromagnetic interference shielding and heat dissipation for integrated circuit assemblies, and, more particularly, to using phase change materials to operate as both an electromagnetic shield and a heat dissipation mechanism for the integrated circuit assemblies.

BACKGROUND

The integrated circuit industry is continually striving to produce ever faster, smaller, and thinner integrated circuit packages for use in various electronic products, including, but not limited to, computer server products and portable products, such as portable computers, electronic tablets, cellular phones, digital cameras, and the like.

As integrated circuit products and packages become smaller, their components are positioned closer to one another. The closeness of the components can give rise to problems with electromagnetic interference and with heat dissipation. With regard to electromagnetic interference, electromagnetic fields may be generated by the components, which may interfere with operation of other components within the products. One approach to reduce such electromagnetic field interference is through the use of a Faraday cage, which is a highly electrically conductive structure that is grounded and encloses selected components within a product or package. Such Faraday cages not only contain electromagnetic fields generated by the component(s) that it encloses, but also prevents external or ambient electromagnetic fields, such as radio frequency energy, from affecting the functionality of the enclosed component(s), as will be understood to those skilled in the art. However, the use of Faraday cages can increase design challenges, manufacturing costs, and the size of the products.

Another approach to reduce electromagnetic field interference is to apply a magnetic absorber material, such as a magnetic tape, to selected components within the products. However, such magnetic absorber materials need to be formulated with specific magnetic properties to absorb specific frequency bands of an electromagnetic field. Also, such magnetic absorber materials can only absorb electromagnetic field frequency bands up to a few gigahertz, so they are not able to mitigate electromagnetic fields that are in the high frequency spectrum.

With regard to heat dissipation, the density of power consumption of electronic components within the integrated circuit devices has increased with the decrease of the size of the electronic components. As will be understood to those skilled in the art, this will increase the average junction temperature of the integrated circuit device. If the temperature of the integrated circuit device becomes too high, the integrated circuits may be damaged or destroyed. As such, thermal solutions, such as integrated heat spreaders, may be employed. These thermal solutions may also be highly electrically conductive, as well as being highly thermally conductive, and, thus, may also be used as electromagnetic shields. However, transient thermal spikes have become an issue, particularly when the integrated circuit package includes a microprocessor utilizing turbo boost technology (also referred to as "dynamic overclocking"), which temporarily increases the microprocessor's operating frequency when demanding tasks are running. Although this dynamic overclocking is transient, the heat generated may exceed the capability for heat removal of the thermal solution in the integrated circuit package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
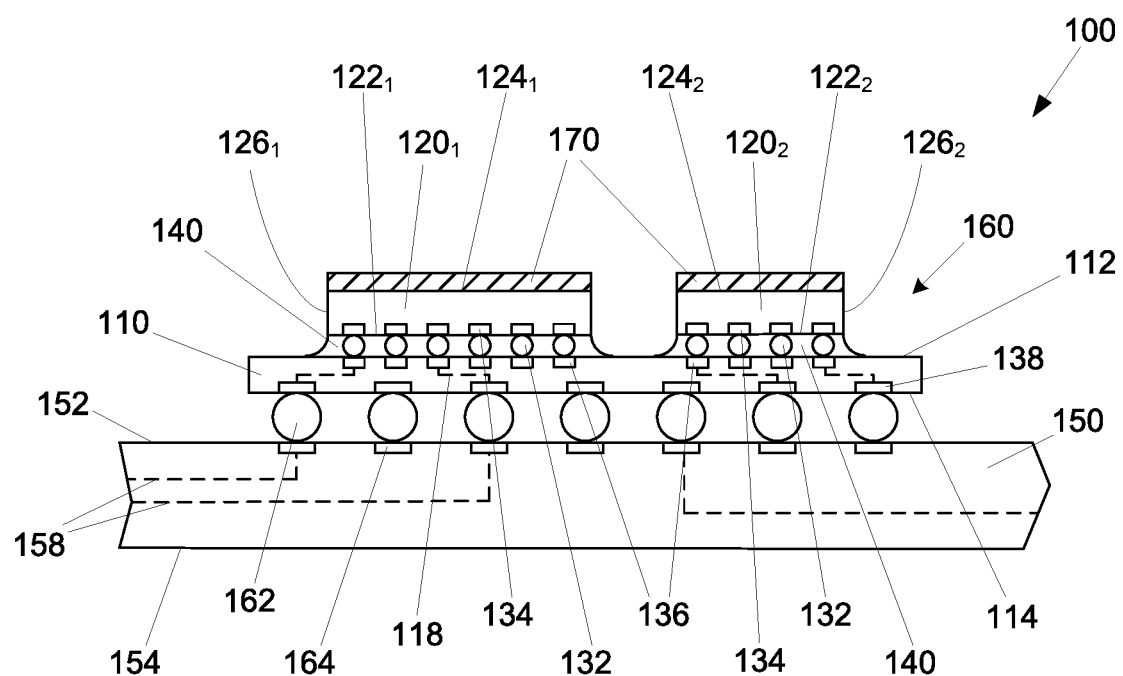
FIG. 1 is a side cross-sectional view of an integrated circuit assembly having a phase change material disposed on integrated circuit devices within the integrated circuit assembly, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include using a phase change material as an electromagnetic shield and as a heat dissipation mechanism for an integrated circuit assembly. In one embodiment, the integrated circuit assembly may comprise an integrated circuit package including a first substrate having a first surface and an opposing second surface, and at least one integrated circuit device having a first surface and an opposing second surface, wherein the at least one integrated circuit device is electrically attached by the first surface thereof to the first surface of the first substrate; and a phase change material formed on the integrated circuit package.

The use of a phase change material as an electromagnetic shield and as a heat dissipation mechanism (e.g. energy storage) eliminates the need of separate solutions for the same. Once the phase change material changes phase, it may serve as a conformable electromagnetic shield and may provide a lower contact resistance compared to using a thermal interface material between an integrated circuit package and a conventional electromagnetic shield, as will be understood to those skilled in the art. With the increasing transient performance demand in integrated circuit packages, such as mobile systems, the embodiments of the present description may provide high thermal conductivity and thermal energy storage to improve transient, burst performance, as previously discussed. Thus, embodiments of the present description provide a solution for the transient thermal performance and help sustain acceptable junction temperatures for significant durations of time in the integrated circuit package.

FIG. 1 illustrates an integrated circuit assembly 100 having at least one integrated circuit device (illustrated as a first integrated circuit device $120_1$ and a second integrated circuit device $120_2$) electrically attached to a first substrate 110 in a configuration generally known as a flip-chip or controlled collapse chip connection ("C4") configuration, to form an integrated circuit package 160, according to an embodiment of the present description.

The first substrate 110 may be any appropriate structure, including, but not limited to, an interposer. The first substrate 110 may have a first surface 112 and an opposing second surface 114. The first substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The first substrate 110 may further include conductive routes 118 or "metallization" (shown as dashed lines) extending through the first substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the first substrate 110 may be a cored substrate or a coreless substrate.

The first integrated circuit device $120_1$ and the second integrated circuit device $120_2$ may be any appropriate device, including, but not limited to, a microprocessor, a chipset, a graphics device, a wireless device, a memory device, an application specific integrated circuit, combinations thereof, stacks thereof, or the like. As shown, the first integrated circuit device $120_1$ may have a first surface $122_1$, an opposing second surface $124_1$, and at least one side $126_1$ extending between the first surface $122_1$ and the second surface $124_1$. The second integrated circuit device $120_2$ may also have a first surface $122_2$, an opposing second surface $124_2$, and at least one side $126_2$ extending between the first surface $122_2$ and the second surface $124_2$.

In an embodiment of the present description, the first integrated circuit device $120_1$ and the second integrated circuit device $120_2$ may be electrically attached to the first substrate 110 with a plurality of device-to-substrate interconnects 132. In one embodiment of the present description, the device-to-substrate interconnects 132 may extend between bond pads 136 on the first surface 112 of the first substrate 110 and bond pads 134 on the first surface $122_1$ of the integrated circuit device $120_1$ and on the first surface $122_2$ of the second integrated circuit device $120_2$. The device-to-substrate interconnects 132 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

The bond pads 134 may be in electrical communication with integrated circuitry (not shown) within their respective integrated circuit devices, i.e. the first integrated circuit device $120_1$ and the second integrated circuit device $120_2$. The bond pads 136 on the first surface 112 of the first substrate 110 may be in electrical contact with the conductive routes 118. The conductive routes 118 may extend through the first substrate 110 and be connected to bond pads 138 on the second surface 114 of the first substrate 110. As will be understood to those skilled in the art, the first substrate 110 may reroute a fine pitch (center-to-center distance between the bond pads) of the integrated circuit device bond pads 134 to a relatively wider pitch of the bond pads 138 on the second surface 114 of the first substrate 110.

An electrically-insulating first underfill material 140 may be disposed between the first integrated circuit device $120_1$ and the first substrate 110, and between the second integrated circuit device $120_2$ and the first substrate 110. The first underfill material 140 may be used to overcome the mechanical stress issues that can arise from thermal expansion mismatch between the first substrate 110 and the integrated circuit devices $120_1$ and $120_2$.

The integrated circuit assembly 100 may further include a second substrate 150, wherein the first substrate 110 is electrically attached thereto. The second substrate 150 may be any appropriate structure, including, but not limited to, a motherboard. The second substrate 150 may have a first surface 152 and an opposing second surface 154. The second substrate 150 may be fabricated in a similar manner and with similar materials as discussed with regard to the first substrate 110. The second substrate 150 may further include conductive routes 158 or "metallization" (shown as dashed lines) extending through the second substrate 150. As will be understood to those skilled in the art, the conductive routes 158 of the second substrate 150 may provide electrical communication pathways to external components (not shown). As will be understood to those skilled in the art, the conductive routes 158 may be a combination of conductive traces (not shown) and conductive vias (not shown) extending through a plurality of dielectric material layers (not shown). These conductive traces and conductive vias are well known in the art and are not shown in FIG. 1 for purposes of clarity. As will be further understood to those skilled in the art, the second substrate 150 may be a cored substrate or a coreless substrate.

In an embodiment of the present description, the first substrate 110 may be electrically attached to the second substrate 150 with a plurality of substrate-to-substrate interconnects 162. In one embodiment of the present description, the substrate-to-substrate interconnects 162 may extend between the bond pads 138 on the second surface 114 of the first substrate 110 and bond pads 164 on the first surface 152 of the second substrate 150. The substrate-to-substrate interconnects 162 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

As further illustrated in FIG. 1 and according to one embodiment of the present description, a phase change material layer 170 may be disposed on the second surface $124_1$ of the first integrated circuit device $120_1$ and on the second surface $124_2$ of the second integrated circuit device $120_2$. A phase change material is a substance with a high heat of fusion, which, when it melts and solidifies, is capable of storing and releasing large amounts of thermal energy. In an embodiment of the present description, the phase change material may include, but is not limited to, metallic alloy systems which include one or more material of bismuth (Bi), lead (Pb), tin (Sn), cadmium (Cd), antimony (Sb), indium (In), thallium (Tl), tellurium (Te), selenium (Se), gallium (Ga), mercury (Hg), sodium (Na), lithium (Li), aluminum (Al), magnesium (Mg), silver (Ag), copper (Cu), zinc (Zn), arsenic (As), potassium (K), rubidium (Rb), calcium (Ca), gold (Au), silicon (Si), and germanium (Ge), Such a metallic alloy system can naturally provide electromagnetic interference shield protection and can also support the demands for higher thermal capacity, higher thermal conductivity, and higher operation stability required for energy storage applications. The metallic phase change material selected for the phase change material layer 170 may have a melting temperature within the operating temperatures of the integrated circuit devices, e.g. the first integrated circuit device $120_1$ and the second integrated circuit device $120_2$, of the integrated circuit package 160. In one embodiment of the present description, the phase change material layer 170 contacts only the at least one integrated circuit device, e.g. the first integrated circuit device $120_1$ and the second integrated circuit device $120_2$.

Figure 2:
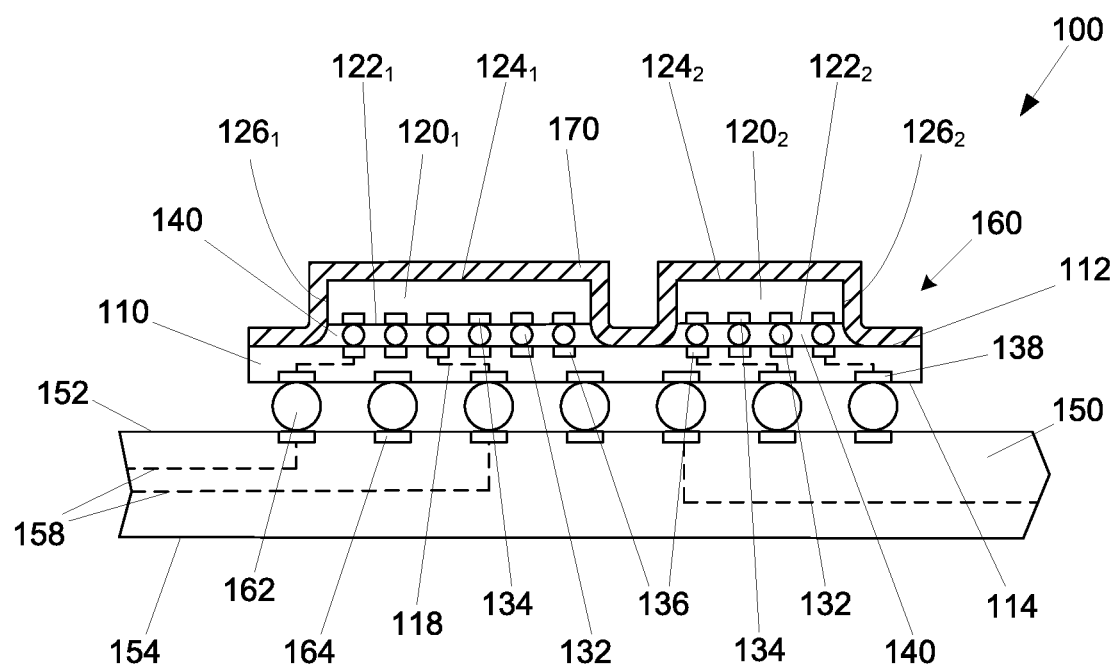
FIG. 2 is a side cross-sectional view of an integrated circuit assembly having a single layer of phase change material disposed on integrated circuit devices within the integrated circuit assembly, according to an embodiment of the present description.

In one embodiment of the present description, shown in FIG. 2, the phase change material layer 170 may comprise a single, substantially conformal layer contacting the first integrated circuit device $120_1$ and the second integrated circuit device $120_2$, and at least a portion of the second surface 114 of the first substrate 110. In one embodiment of the present description, the phase change material layer 170 contacts only the at least one integrated circuit device, e.g. the first integrated circuit device $120_1$ and the second integrated circuit device $120_2$, and the second surface 114 of the first substrate 110.

Figure 3:
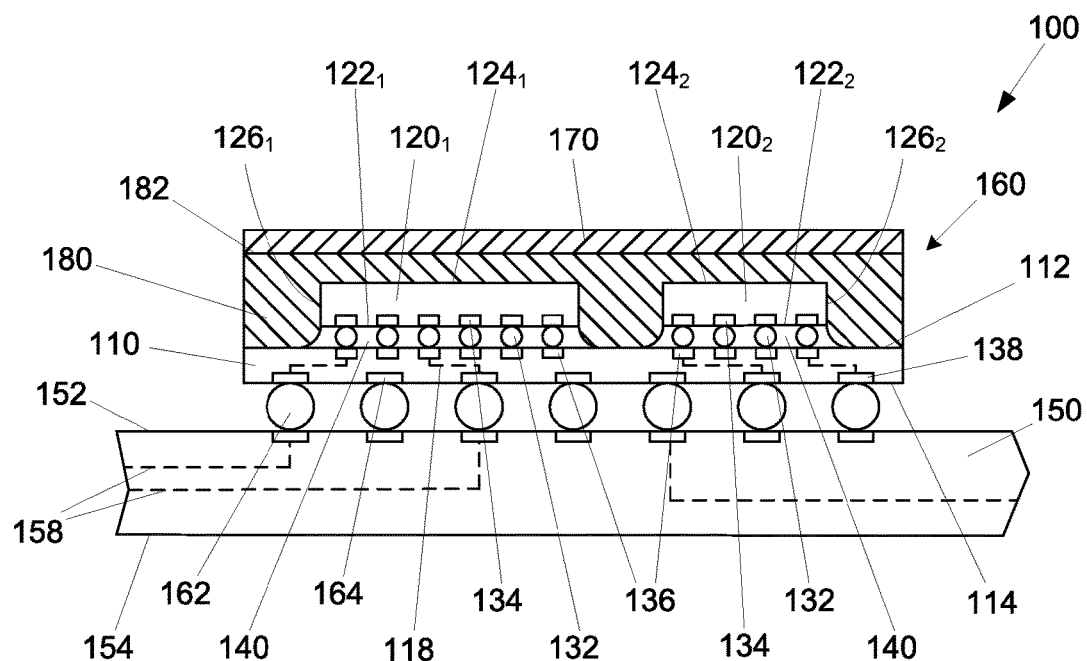
FIG. 3 is a side cross-sectional view of an integrated circuit assembly including an integrated package having at least one integrated circuit device attached to a first substrate and a mold material encapsulating the at least one integrated circuit device with a phase change material disposed on the mold material, according to an embodiment of the present description.

In another embodiment of the present description, shown in FIG. 3, a mold material 180 may be formed over the first integrated circuit device $120_1$ and the second integrated circuit device $120_2$, and at least a portion of the second surface 114 of the first substrate 110, wherein a first surface 182 of the mold material 180 is formed opposing the first substrate 110. The phase change material layer 170 may be disposed on the first surface 182 of the mold material 180. In one embodiment, the integrated circuit devices, e.g. the first integrated circuit device $120_1$ and the second integrated circuit device $120_2$, may be encapsulated between the mold material 180 and the second surface 114 of the first substrate 110. In one embodiment of the present description, the phase change material layer 170 contacts only the mold material 180.

Figure 4:
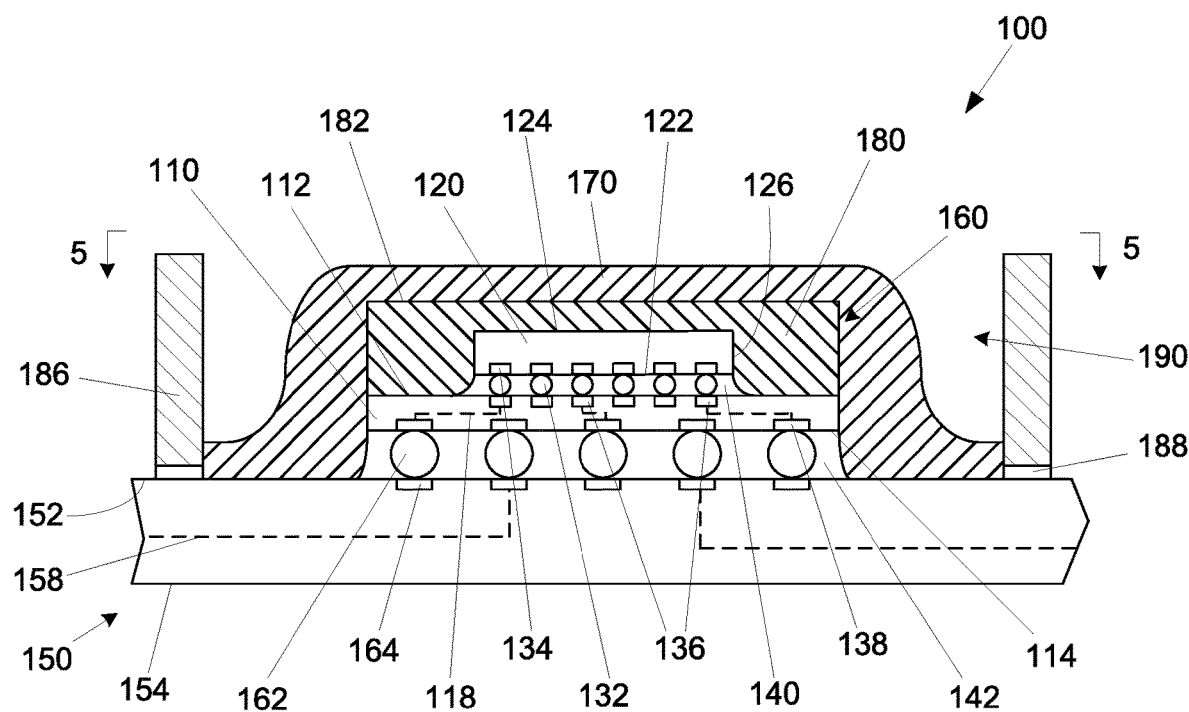
FIG. 4 is a side cross-sectional view of an integrated circuit assembly having an integrated circuit package attached to a second substrate and a phase change material disposed on the integrated circuit package and on the second substrate, wherein the phase change material is contained with a stand-off structure adjacent the integrated circuit package, according to an embodiment of the present description.

In an embodiment of the present description, shown in FIG. 4, the integrated circuit assembly 100 may include at least one system stand-off structure 186 extending from the first surface 152 of the second substrate 150. The system stand-off structure 186 may be attached to the first surface 152 of the second substrate 150 with the attachment adhesive, sealant layer, or solder layer 188. The attachment adhesive, sealant layer, or solder layer 188 may be any appropriate material, including, but not limited to, silicones (such as polydimethylsiloxane), epoxies, solders, and the like. The integrated circuit package 160 of FIG. 4 is illustrated with a single integrated circuit device 120 having a first surface 122, an opposing second surface 124, and at least one side 126 extending between the first surface 122 and the second surface 124.

Figure 5:
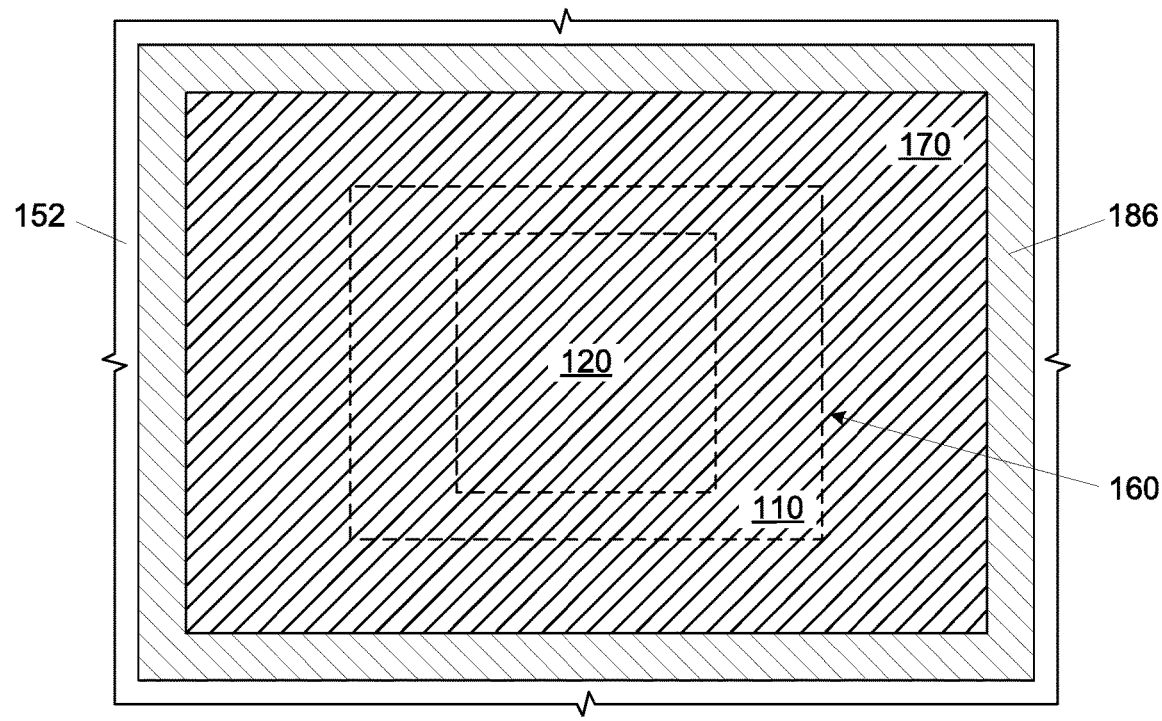
FIG. 5 is a top plan view along line 5-5 of FIG. 4, according to one embodiment of the present description.

In one embodiment of the present description, shown in FIG. 5, the system stand-off structure 186 may be a single "picture frame" structure surrounding the integrated circuit package 160, e.g. the integrated circuit device 120 and the first substrate 110. Referring again to FIG. 4, the system stand-off structure 186 may act as a barrier wall for the phase change material layer 170. In one embodiment, as shown, the phase change material layer 170 may contact the integrated circuit package 160, the first surface 152 of the second substrate 150, and the system stand-off structure 186.

Figure 6:
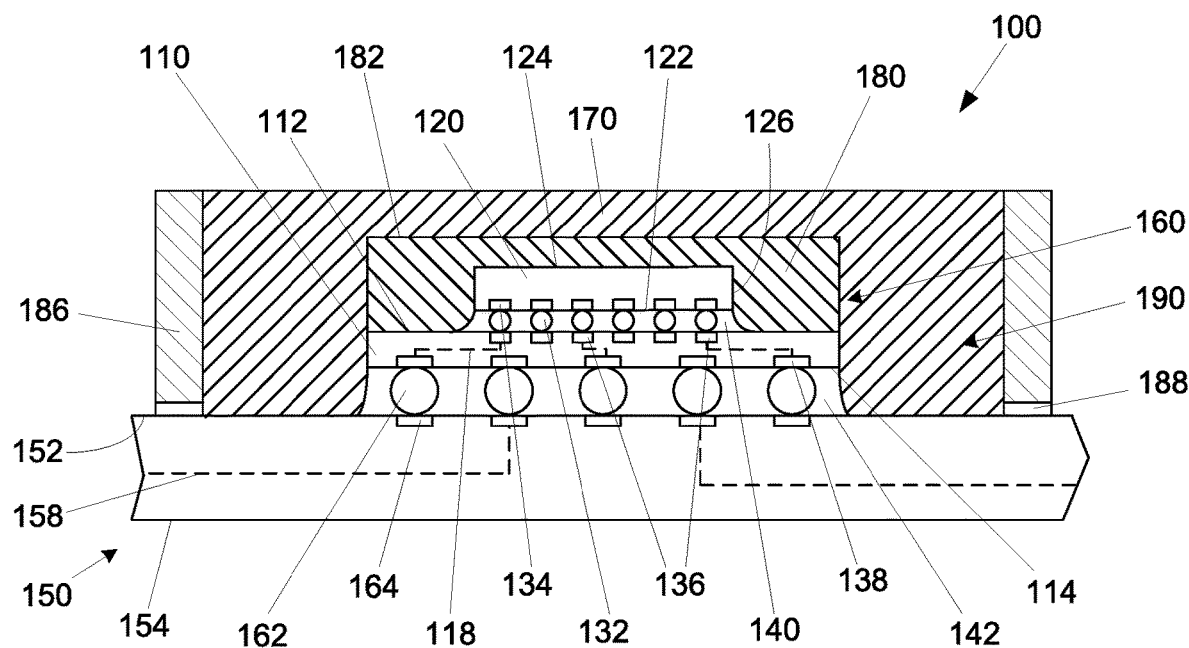
FIG. 6 is a side cross-sectional view of an integrated circuit assembly having a phase change material substantially filling a chamber defined by a stand-off structure encircling the integrated circuit package of the integrated circuit assembly, according to an embodiment of the present description.

As shown in FIG. 6, the integrated circuit assembly 100 of FIG. 4 may have the phase change material layer 170 substantially filling a cavity 190 defined by the system stand-off structure 186. Substantially filling the cavity 190 with the phase change material layer 170 may increase the thermal capacitance (thermal energy storage) of the integrated circuit assembly 100, which may allow for thermal performance regardless of high power densities and turbo boosting.

It is noted that an electrically-insulating second underfill material 142 may be disposed between the first substrate 110 and the second substrate 150, as shown in FIGS. 4 and 6. The second underfill material 142 may be used to overcome the mechanical stress issues that can arise from thermal expansion mismatch between the first substrate 110 and the second substrate 150.

Figure 7:
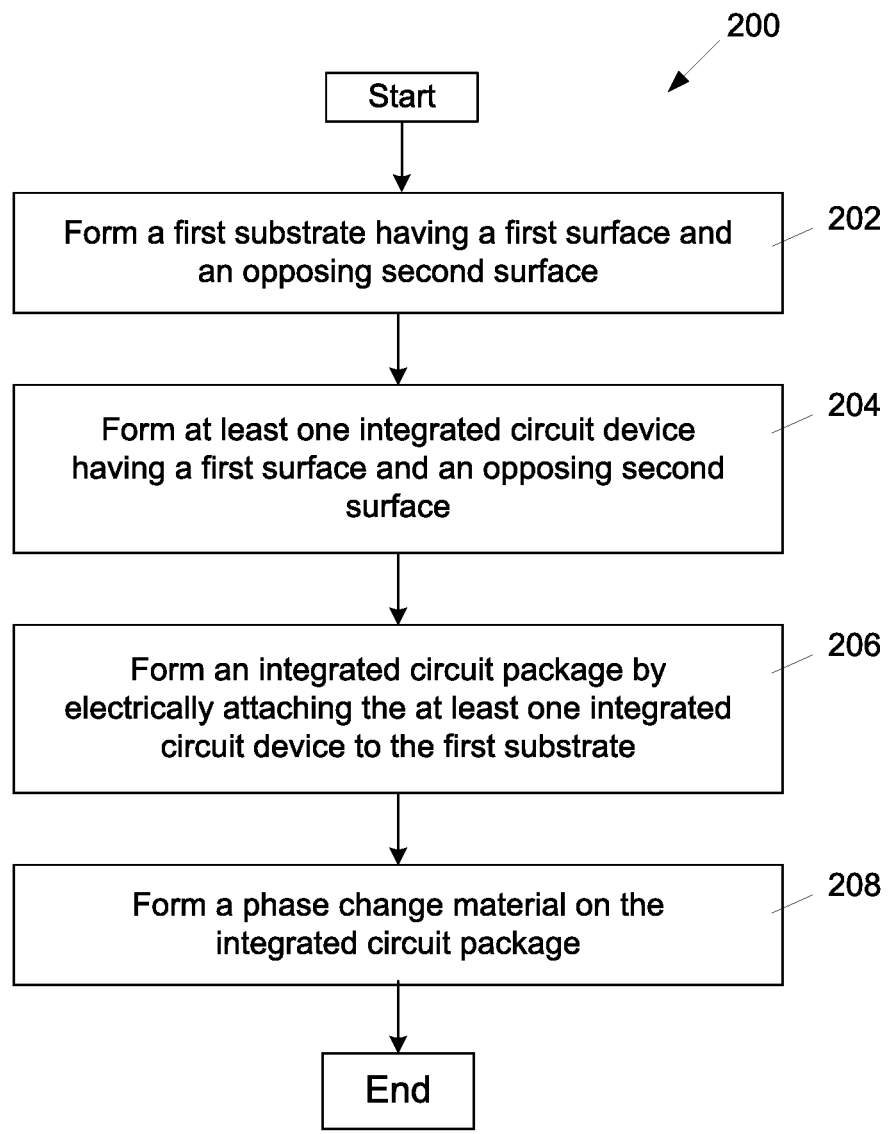
FIG. 7 is a flow diagram of a method of fabricating an integrated circuit assembly, according to one embodiment of the present description.

FIG. 7 is a flow chart of a process 200 of fabricating an integrated circuit assembly according to an embodiment of the present description. As set forth in block 202, a first substrate having a first surface and an opposing second surface may be formed. At least one integrated circuit device may be formed having a first surface and an opposing second surface, as set forth in block 204. As set forth in block 206, an integrated circuit package may be formed by electrically attaching the at least one integrated circuit device to the first substrate. A first phase change material may be formed on the integrated circuit package, as set forth in block 208.

Figure 8:
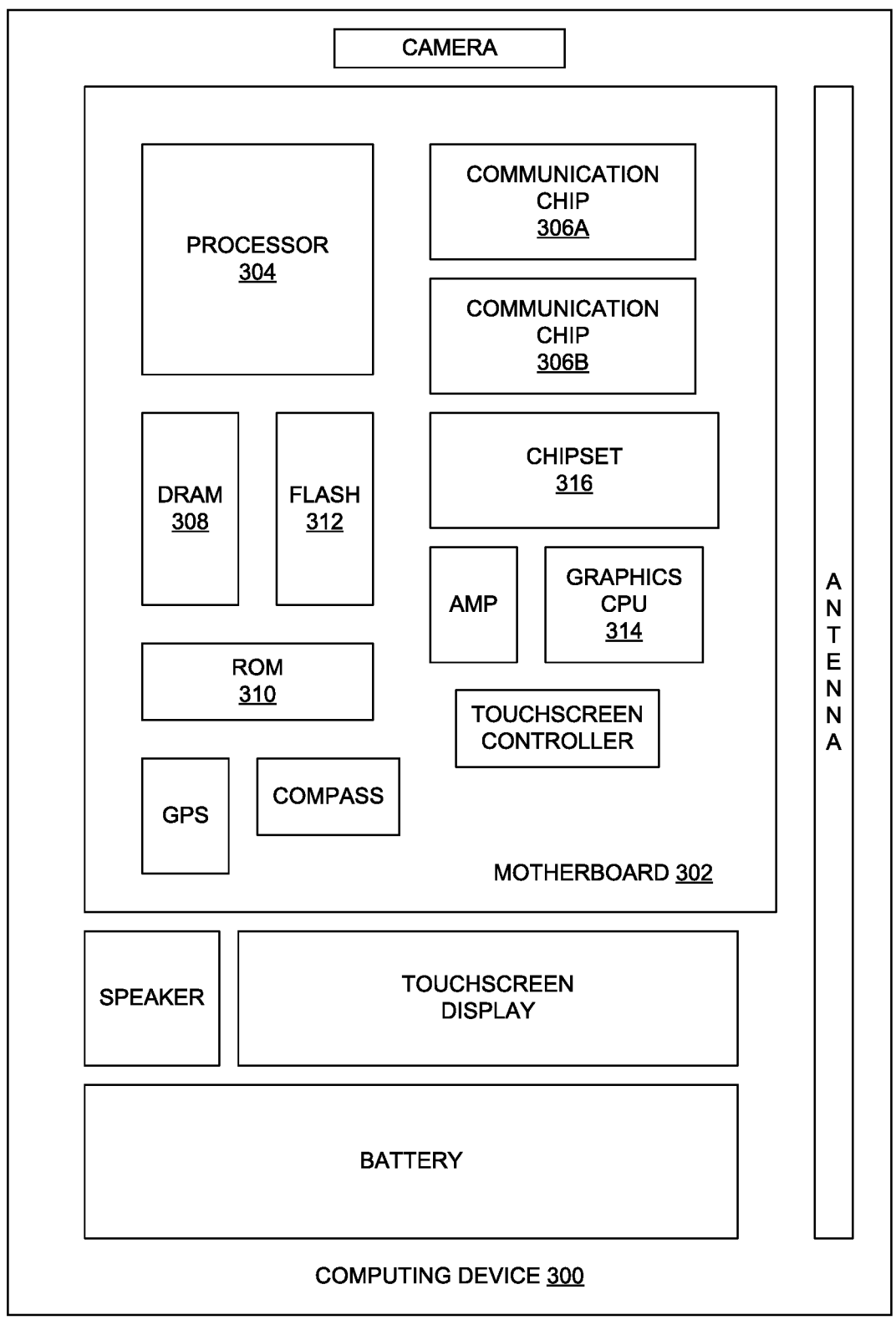
FIG. 8 is an electronic device/system, according to an embodiment of the present description.

FIG. 8 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit structure comprising an integrated circuit package including a first substrate having a first surface and an opposing second surface, and at least one integrated circuit device having a first surface and an opposing second surface, wherein the at least one integrated circuit device is electrically attached by the first surface thereof to the first surface of the first substrate; and a phase change material formed on the integrated circuit package.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   an integrated circuit package comprising a first substrate having a first surface and an opposing second surface, and at least one integrated circuit device having a first surface and an opposing second surface, wherein the at least one integrated circuit device is electrically attached by the first surface thereof to the first surface of the first substrate;
   a mold material abutting the at least one integrated circuit device and the first surface of the first substrate;
   a second substrate having a first surface, wherein the integrated circuit package is electrically attached to the first surface of the second substrate; and
   a phase change material on the mold material and on the first surface of the second substrate wherein the phase change material comprises a metallic alloy system, wherein the metallic alloy system comprises one or more of bismuth, lead, tin, cadmium, antimony, indium, thallium, tellurium, selenium, gallium, mercury, sodium, lithium, aluminum, magnesium, silver, copper, zinc, arsenic, potassium, rubidium, calcium, gold, silicon, and germanium, and wherein the metallic alloy system has a melting temperature within an operating temperature range of the at least one integrated circuit device.

2. The integrated circuit assembly of claim 1, wherein the mold material is between the opposing second surface of the at least one integrated circuit device and the phase change material.

3. The integrated circuit assembly of claim 1, further comprising a stand-off structure extending from the first surface of the second substrate and substantially surrounding the integrated circuit package.

4. The integrated circuit assembly of claim 3, wherein the phase change material contacts the stand-off structure.

5. The integrated circuit assembly of claim 3, wherein the stand-off structure is attached to the first surface of the second substrate by an attachment adhesive.

6. The integrated circuit assembly of claim 5, wherein the attachment adhesive comprises one of a silicone, an epoxy, or a solder.

7. An electronic system, comprising:
a housing;
a motherboard having a first surface disposed within the housing;
an integrated circuit package electrically attached to the first surface of the motherboard, wherein the integrated circuit package comprises:
a first substrate comprising a first surface and an opposing second surface, and at least one integrated circuit device having a first surface and an opposing second surface, wherein the at least one integrated circuit device is electrically attached by the first surface thereof to the first surface of the first substrate;
a mold material abutting the at least one integrated circuit device and the first surface of the first substrate wherein the integrated circuit package is electrically attached to the first surface of the motherboard by the opposing second surface of the first substrate; and
a phase change material on the mold material and on the first surface of the motherboard wherein the phase change material comprises a metallic alloy system, wherein the metallic alloy system comprises one or more of bismuth, lead, tin, cadmium, antimony, indium, thallium, tellurium, selenium, gallium, mercury, sodium, lithium, aluminum, magnesium, silver, copper, zinc, arsenic, potassium, rubidium, calcium, gold, silicon, and germanium, and wherein the metallic alloy system has a melting temperature within an operating temperature range of the at least one integrated circuit device.

8. The electronic system of claim 7, wherein the mold material is between the opposing second surface of the at least one integrated circuit device and the phase change material.

9. The electronic system of claim 7, further comprising a stand-off structure extending from the first surface of the motherboard and substantially surrounding the integrated circuit package.

10. The electronic system of claim 9, wherein the phase change material contacts the stand-off structure.

11. The electronic system of claim 9, wherein the stand-off structure is attached to the first surface of the second substrate by an attachment adhesive.

12. The electronic system of claim 11, wherein the attachment adhesive comprises one of a silicone, an epoxy, or a solder.

13. An integrated circuit assembly, comprising:
an integrated circuit package comprising a first substrate having a first surface and an opposing second surface, and an integrated circuit device having a first surface and an opposing second surface, wherein the integrated circuit device is electrically coupled by the first surface thereof to the first surface of the first substrate, and wherein the integrated circuit device is an uppermost integrated circuit device of the integrated circuit package;
a mold material over the opposing second surface of the integrated circuit device; and
a phase change material over the mold material and the opposing second surface of the integrated circuit device such that the mold material is between the opposing second surface of the integrated circuit device and the phase change material, wherein the phase change material comprises a metallic alloy system, wherein the metallic alloy system comprises one or more of bismuth, lead, tin, cadmium, antimony, indium, thallium, tellurium, selenium, gallium, mercury, sodium, lithium, aluminum, magnesium, silver, copper, zinc, arsenic, potassium, rubidium, calcium, gold, silicon, and germanium, and wherein the metallic alloy system has a melting temperature within an operating temperature range of the at least one integrated circuit device.

14. The integrated circuit assembly of claim 13, further comprising a second substrate having a first surface, wherein the integrated circuit package is electrically attached to the first surface of the second substrate and wherein the phase change material is on the first surface of the second substrate.

15. The integrated circuit assembly of claim 14, further comprising a stand-off structure extending from the first surface of the second substrate and substantially surrounding the integrated circuit package.

16. The integrated circuit assembly of claim 15, wherein the phase change material contacts the stand-off structure.

17. The integrated circuit assembly of claim 15, wherein the stand-off structure is attached to the first surface of the second substrate by an attachment adhesive.

18. The integrated circuit assembly of claim 17, wherein the attachment adhesive comprises one of a silicone, an epoxy, or a solder.

* * * * *